United States Patent [19]
Murakami

[11] Patent Number: 5,539,619
[45] Date of Patent: Jul. 23, 1996

[54] BRANCH JOINT BOX

[75] Inventor: Koji Murakami, Yokkaichi, Japan

[73] Assignee: Sumitomo Wiring Systems, Ltd., Yokkaichi, Japan

[21] Appl. No.: 547,586

[22] Filed: Oct. 24, 1995

Related U.S. Application Data

[63] Continuation of Ser. No. 293,912, Aug. 22, 1994, abandoned.

[30] Foreign Application Priority Data

Sep. 22, 1993 [JP] Japan ..................... 5-236275

[51] Int. Cl.⁶ ............... H01R 23/68; H05K 1/00
[52] U.S. Cl. ............. 361/785; 361/749; 439/65; 439/77; 439/544
[58] Field of Search ................... 361/749–751, 361/760–764, 785–791; 439/43, 52–53, 55, 65, 77, 544, 709; 174/260

[56] References Cited

U.S. PATENT DOCUMENTS

| | | |
|---|---|---|
| 4,355,853 | 10/1982 | Kourimsky . |
| 4,858,071 | 8/1989 | Manabe et al. . |
| 5,348,482 | 9/1994 | Rudy, Jr. et al. ................. 439/61 |

FOREIGN PATENT DOCUMENTS

| | | |
|---|---|---|
| 61-126783 | 6/1986 | Japan . |
| 63-265487 | 4/1987 | Japan . |
| 1202109 | 2/1988 | Japan . |

*Primary Examiner*—Bot L. Ledynh
*Attorney, Agent, or Firm*—Greenblum & Bernstein

[57] ABSTRACT

A branch joint box comprising: a casing which is made of resin and includes a bottom wall; a plurality of connector blocks which are provided on a front face of the bottom wall and each include a plurality of terminals erected from the front face of the bottom wall such that distal ends of the terminals are projected from a rear face of the bottom wall; and a sheetlike flexible printed circuit board which is secured to the rear face of the bottom wall and has a conductive pattern such that the distal ends of the terminals are soldered to the conductive pattern of the flexible printed circuit board.

6 Claims, 5 Drawing Sheets

BRANCH JOINT BOX

This application is a continuation of application Ser. No. 08/293,912, filed Aug. 22, 1994, now abandoned.

BACKGROUND OF THE INVENTION

The present invention generally relates to branch joint box used for branch connection of wiring harnesses of a motor vehicle and more particularly, to a branch joint box in which a plurality of connector blocks each having a plurality of terminals are formed integrally with a bottom wall such that the terminals are connected to each other by a printed circuit board.

A branch joint box in which a printed circuit board is used for connecting terminals to each other is known from, for example, Japanese Patent Laid-Open Publication Nos. 61-126783 (1986) and 63-265487 (1988) as shown in FIGS. 1 to 3. In FIG. 1, a plurality of connector blocks 3 are provided on an upper face of a bottom wall 2 of an upper casing 1 of the branch joint box. In each of the connector blocks 3, a plurality of pin type terminals 4 are erected vertically on the upper face of the bottom wall 2. A printed circuit board 5 for connecting the terminals 4 of the connector blocks 3 is secured to a lower face of the bottom wall 2 by screwing or resinous caulking.

In FIG. 2, the connector blocks 3 are molded integrally with the bottom wall 2 of the upper casing 1 by resin and the bottom wall 2 serves also to support the terminals 4 of the connector blocks 3. Each of the terminals 4 is inserted through the bottom wall 2 and the printed circuit board 5 so as to project out of a lower face of the printed circuit board 5 and a distal end 4a of the terminal 4, which projects out of the lower face of the printed circuit board 5, is fixed to a conductive pattern of the printed circuit board 5 by a solder portion A. The printed circuit board 5 is generally produced by impregnating a plain paper sheet with phenolic resin and hardening the impregnated paper sheet to a thick platelike shape. Meanwhile, the upper casing 1 is generally made of polypropylene or the like and is reinforced by talc, etc.

In addition to the above mentioned known branch joint box shown in FIGS. 1 to 3, FIG. 4 shows another branch joint box in which a plurality of connector blocks 3 made of resin are provided separately from a thick printed circuit board 5 so as to be secured to the printed circuit board 5 by screws, etc.

In the known branch joint box of FIGS. 1 to 3 in which the printed circuit board 5 obtained by hardening the impregnated paper sheet to a platelike shape is secured to the bottom wall 2 of the resinous upper casing 1 such that wiring is performed among the terminals 4, coefficient of thermal expansion of the resinous upper casing 1 is quite higher, for example, 5 to 10 times higher than that of the printed circuit board 5. Therefore, even when the printed circuit board 5 is hardly deformed by temperature changes, the resinous upper casing 1 is subjected to large thermal expansion or contraction, so that the following inconveniences (1) and (2) are incurred.

(1) Due to difference in thermal deformation between the upper casing 1 and the printed circuit board 5, terminal holes 7 of the bottom wall 2 are brought out of alignment with terminal holes 8 of the printed circuit board 5, so that the terminals 4 are slanted as shown by the imaginary lines in FIG. 3 and thus, large tensile stress or compression stress is applied to the solder portions A. Upon repetitive application of such stress to the solder portions A, cracks are produced on the solder portions A, thereby resulting in a possibility of improper electrical conduction.

(2) Furthermore, when the pin type terminals 4 are slanted as described above, the terminals 4 deviate greatly from terminal receiving bores of a connector of a wiring harness, respectively and thus, the connector of the wiring harness cannot be connected to the terminals 4 smoothly.

Meanwhile, also in another prior art branch joint box shown in FIG. 4, the same problems as described above arise.

Moreover, a branch joint box in which a flexible sheet is used for the printed circuit board has been also developed as disclosed in, for example, Japanese Patent Laid-Open Publication No. 1-202109 (1989). In this prior art branch joint box, bus bars are also used and bent terminals are formed integrally with the sheetlike printed circuit board. However, in this prior art branch joint box, since the sheetlike printed circuit board is employed as direct contacts for the terminals, the printed circuit board should be reinforced by using a reinforcing plate or the like, so that assembly of the prior art branch joint box is time-consuming. Furthermore, mechanical strength of the terminals in this prior art branch joint box is lower than that of the construction employing soldering for securing the terminals to the printed circuit board.

SUMMARY OF THE INVENTION

Accordingly, an essential object of the present invention is to provide a branch joint box in which while terminals are soldered to a printed circuit board, slant of the terminals due to difference in thermal deformation between a casing and the printed circuit board is prevented such that production of cracks on solder portions is eliminated.

In order to accomplish this object of the present invention, a branch joint box according to the present invention comprises: a casing which is made of resin and includes a bottom wall; a plurality of connector blocks which are provided on a front face of the bottom wall and each include a plurality of terminals erected from the front face of the bottom wall such that distal ends of the terminals are projected from a rear face of the bottom wall; and a sheetlike flexible printed circuit board which is secured to the rear face of the bottom wall and has a conductive pattern such that the distal ends of the terminals are soldered to the conductive pattern of the flexible printed circuit board.

Meanwhile, in order to simplify construction of the branch joint box, the connector blocks and the bottom wall of the casing are molded integrally with each other by resin.

On the other hand, the connector blocks may be provided separately from the bottom wall of the casing so as to be secured to the bottom wall by a fastening means.

Such a case may happen in which the branch joint box provided in an engine room is exposed to high temperatures by operating the engine or low temperatures through sudden change from high temperatures. When the bottom wall of the casing is thermally expanded or contracted greatly by such thermal changes, the sheetlike flexible printed circuit board is pulled by the terminals so as to be expanded or contracted in conformity with expansion or contraction of the bottom wall of the casing even if coefficient of thermal expansion of the flexible printed circuit board is far lower than that of the casing. As a result, slant of the terminals is prevented and production of cracks on the solder portions is prevented by alleviating stress concentration at the solder portions.

BRIEF DESCRIPTION OF THE DRAWINGS

This object and features of the present invention will become apparent from the following description taken in conjunction with the preferred embodiments thereof with reference to the accompanying drawings, in which.

Before the description of the present invention proceeds, it is to be noted that like parts are designated by like reference numerals throughout several views of the accompanying drawings.

DETAILED DESCRIPTION OF THE INVENTION

Figure 1:
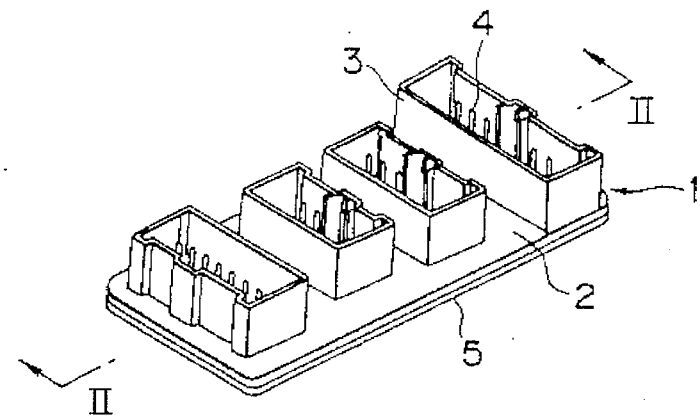
FIG. 1 is a fragmentary perspective view of a prior art branch joint box (already referred to)
Figure 2:
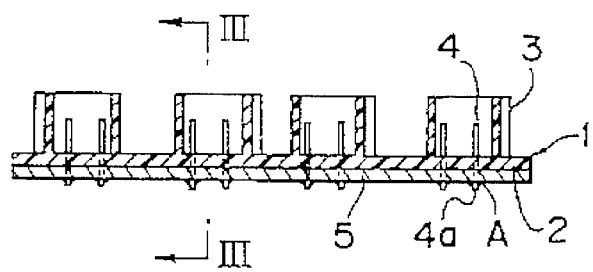
FIG. 2 is a sectional view taken along the line II—II in FIG. 1 (already referred to)
Figure 3:
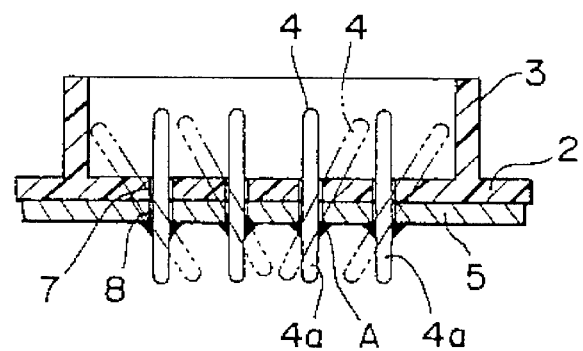
FIG. 3 is a sectional view taken along the line III—III in FIG. 2 (already referred to)
Figure 4:
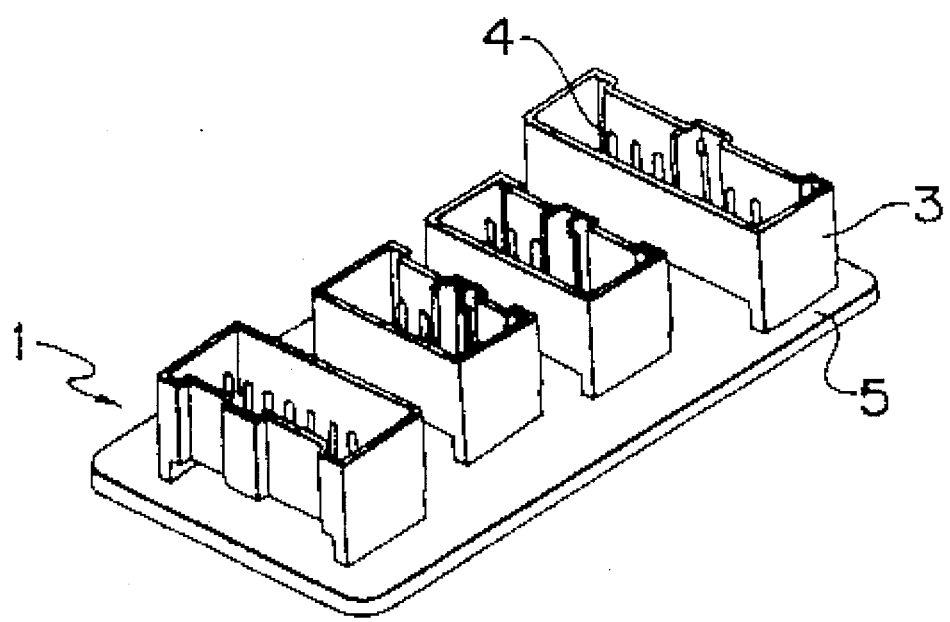
FIG. 4 is a fragmentary perspective view of another prior art branch joint box (already referred to)
Figure 5:
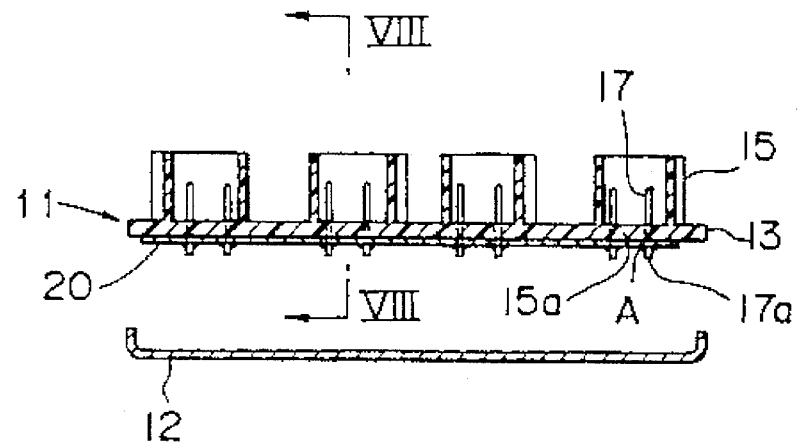
FIG. 5 is a longitudinal sectional view of a branch joint box according to a first embodiment of the present invention.

Referring now to the drawings, there is shown in FIGS. 5 to 8, a branch joint box according to a first embodiment of the present invention. A casing of the branch joint box includes an upper casing 11 and a lower casing 12, which are made of polypropylene or the like mixed with talc, etc. The upper casing 11 includes a thick flat bottom wall 13 for supporting a plurality of connector blocks 15. The connector blocks 15 are molded integrally with the bottom wall 13 by resin so as to be formed on an upper face of the bottom wall 13. The connector blocks 15 are arranged such that neighboring ones of the connector blocks 15 are spaced a distance from each other. Furthermore, each of the connector blocks 15 is formed into a boxlike shape having an upper opening. A plurality of pin type terminals 17 in each of the connector blocks 15 are embedded in the bottom wall 13 and thus, the bottom wall 13 serves also to support the terminals 17. Although not specifically shown, the terminals 17 of each connector block 15 are, respectively, fitted into terminal receiving bores of a connector of a wiring harness. Each of the terminals 17 is inserted through the bottom wall 13 so as to project, as a distal end 17a, out of a lower face of the bottom wall 13.

Figure 6:
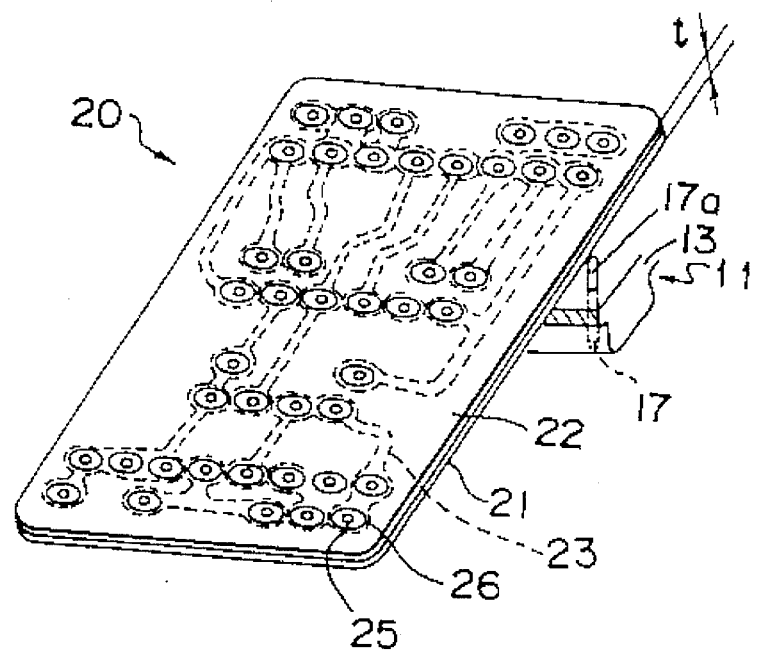
FIG. 6 is a perspective view of a flexible printed circuit board employed in the branch joint box of FIG. 5.

A flexible printed circuit board (FPC) 20 having a thin sheetlike shape is provided on the lower face of the bottom wall 13. FIG. 6 shows the flexible printed circuit board 20 prior to its mounting on the bottom wall 13. The flexible printed circuit board 20 is obtained by bonding to each other two insulating sheets 21 and 22 made of polyimide, polyester or the like. A conductive pattern 23 is formed on one insulating sheet 21 and terminal holes 25 are, respectively, formed at predetermined locations on the conductive pattern 23. The other insulating sheet 22 for covering one insulating sheet 21 is formed, at its locations corresponding to the terminals holes 25, with solder holes 26 for solder portions A, which are larger than the terminal holes 25. The flexible printed circuit board 20 has a quite small thickness of about 0.05 to 0.3 mm. Thus, the distal end 17a of the pin type terminal 17 is passed through the terminal hole 25 and the solder hole 26 from one insulating sheet 21.

Figure 7:
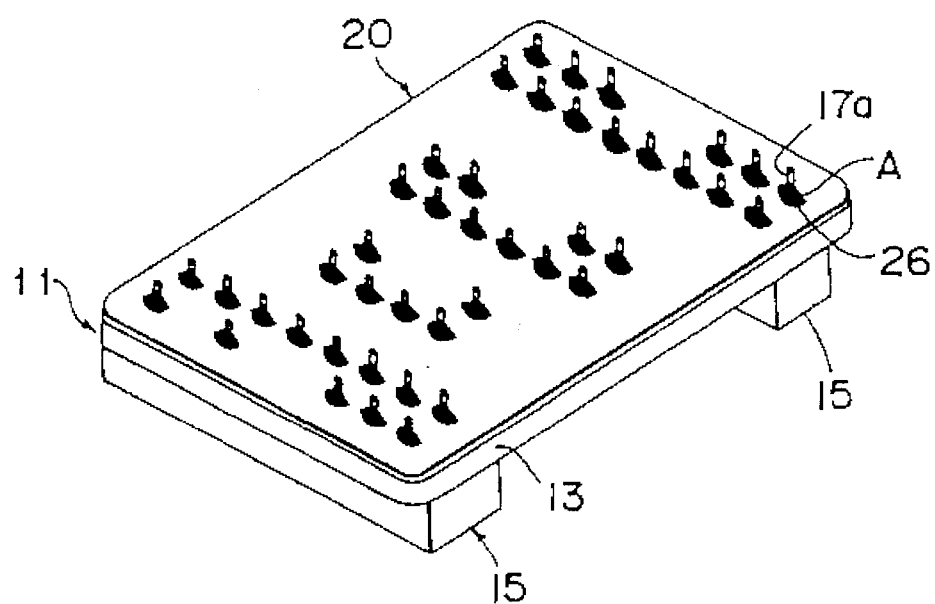
FIG. 7 is a perspective view of a rear side of an upper casing of the branch joint box of FIG. 5 after its assembly.

FIG. 7 shows a rear side of the upper casing 11 after its assembly. The solder portions A are, respectively, formed at the solder holes 26 by soldering. Thus, the distal end 17a of each of the pin type terminals 17 is electrically connected to and mechanically fixed to the predetermined location on the conductive pattern 23 of the flexible printed circuit board 20 positively by the solder portion A. Meanwhile, as a result, the flexible printed circuit board 20 itself is also fixed to the lower face of the upper casing 11.

Figure 8:
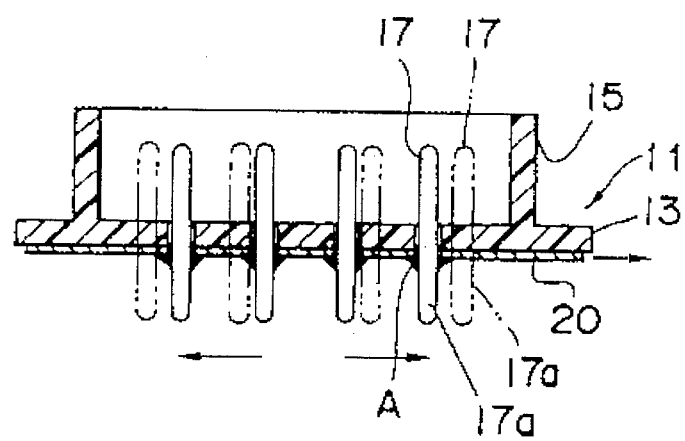
FIG. 8 is a sectional view taken along the line VIII—VIII in FIG. 5.

The branch joint box of the above described arrangement is operated as follows. In FIG. 8, even if the bottom wall 13 of the upper casing 11 is subjected to large thermal expansion upon, for example, thermal changes in an engine room, etc., the sheetlike flexible printed circuit board 20 is pulled by the pins 17 in response to thermal expansion of the bottom wall 13 so as to be expanded. Therefore, as shown by the imaginary lines in FIG. 8, although the terminals 17 are shifted slightly, the terminals 17 maintain vertical orientation. Furthermore, since large stress is not concentrated at the solder portions A, production of cracks on the solder portions A is prevented.

Meanwhile, also in case the bottom wall 13 of the upper casing 11 is contracted greatly due to cooling of the engine room, the thin flexible printed circuit board 20 is also contracted by the pins 17 as in the case of thermal expansion of the bottom wall 13 and thus, stress concentration at the solder portions A is alleviated.

Figure 9:
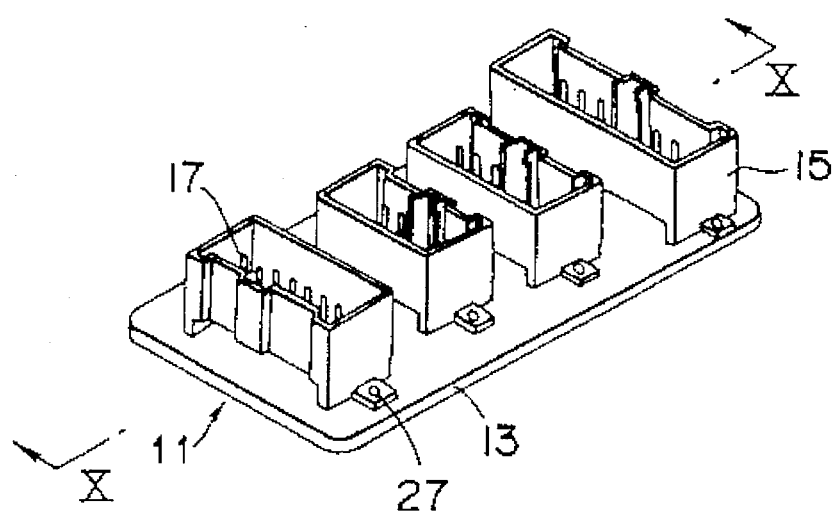
FIG. 9 is a fragmentary perspective view of a branch joint box according to a second embodiment of the present invention.
Figure 10:
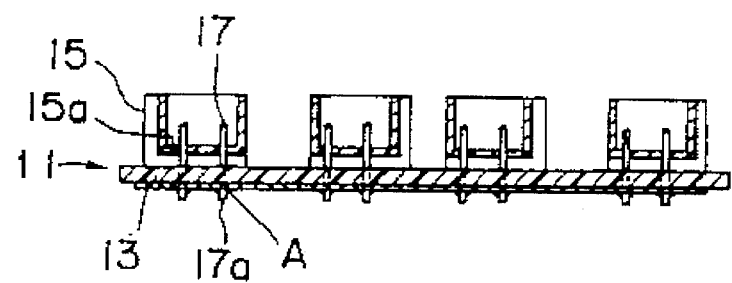
FIG. 10 is a sectional view taken along the line X—X in FIG. 9.

FIGS. 9 and 10 show a branch joint box according to a second embodiment of the present invention. As shown in FIG. 9, the connector blocks 15 are provided separately from the bottom wall 13 and thus, are mounted on the bottom wall 13 by using fastening means such as screws 27. As shown in FIG. 10, the pin type terminal 17 is passed through a terminal support wall 15a of the connector block 15, the bottom wall 13 and the flexible printed circuit board 20 so as to be connected to the conductive pattern of the flexible printed circuit board 20 by soldering in the same manner as in the above mentioned first embodiment. Since other constructions of the branch joint box are similar to those of the branch joint box of the first embodiment, the description is abbreviated for the sake of brevity.

The present invention may also be applied to a branch joint box in which the upper casing 11 and the lower casing 12 are formed integrally with each other through a thin wall portion acting as a hinge, etc.

As is clear from the foregoing description of the branch joint box of the present invention, the following effects (1) to (4) can be achieved.

(1) By using the sheetlike flexible printed circuit board 20 while proper electrical and mechanical connection between the conductive pattern 23 of the flexible printed circuit board 20 and the terminals 17 is maintained, production of cracks on the solder portions A and slant of the terminals 17 can be prevented at the time of expansion or contraction of the casing 11 due to thermal changes.

Namely, not only reliability of electrical conduction is improved but durability is achieved. Especially, the present invention is most suitable for the connector block in which the pin type terminals 17 are erected.

(2) By using the thin sheetlike flexible printed circuit board, the branch joint box as a whole can be reduced in weight and in volume.

(3) By performing integral molding of the bottom wall 13 of the upper casing 11 and the connector blocks 15 by resin, the branch joint box as a whole can be simplified structurally.

(4) On the other hand, when the connector blocks 15 are provided separately from the bottom wall 13 of the upper casing 11 and are fixed to the bottom wall 13 by proper fastening means, the same upper casing 11 can be used for various connector blocks 15 having different shapes and thus, versatility of the upper casing 11 is upgraded.

What is claimed is:

1. A branch joint box comprising:

a casing which is made of a resin and includes a bottom wall;

a plurality of connector blocks which are provided on a front face of the bottom wall;

said casing including a plurality of terminals erected from the front face of the bottom wall such that distal ends of the terminals are projected from a rear face of the bottom wall;

an interior of said plurality of connector blocks enclosing said plurality of terminals;

a sheetlike flexible printed circuit board which contact substantially a common area of, and is secured to, the rear face of the bottom wall and has a conductive pattern such that the distal ends of the terminals are soldered to the conductive pattern of the flexible printed circuit board; and said flexible printed circuit board and said bottom wall having different coefficients of thermal expansion.

2. A branch joint box as claimed in claim 1, wherein the connector blocks and the bottom wall of the casing are molded integrally with each other by resin.

3. A branch joint box as claimed in claim 1, wherein the connector blocks are provided separately from the bottom wall of the casing so as to be secured to the bottom wall by a fastening means.

4. A branch joint box, comprising:

a bottom wall;

a plurality of terminals, implanted in said bottom wall, having first and second ends;

at least one connector block disposed on a front face of said bottom wall and surrounding said first ends of said plurality of terminals;

a flexible printed circuit board in contact with substantially an entire common area with a rear face of said bottom wall and having a conductive pattern thereon;

said second ends of said plurality of terminals being soldered to said conductive pattern; and said bottom wall and said flexible printed circuit board having different coefficients of thermal expansion.

5. A branch joint box according to claim 4, wherein said at least one connector block is integrally formed with said bottom wall.

6. A branch joint box according to claim 4, further comprising:

said at least one connecter block is mounted on said bottom wall; and said first ends of said plurality of terminals passing through and projecting from a bottom of said at least one connector block.

* * * * *